United States Patent [19]

Breitenbach

[11] 4,162,464
[45] Jul. 24, 1979

[54] DELAY LINE

[75] Inventor: Otto Breitenbach, Nüremberg, Fed. Rep. of Germany

[73] Assignee: Kabel-und Metallwerke Gutehoffnungshutte Aktiengesellschaft, Hannover, Fed. Rep. of Germany

[21] Appl. No.: 850,598

[22] Filed: Nov. 11, 1977

[30] Foreign Application Priority Data

Nov. 12, 1976 [DE] Fed. Rep. of Germany ....... 2651597

[51] Int. Cl.² .......................... H01P 9/02; H03H 7/30
[52] U.S. Cl. .................................... 333/138; 333/140; 333/162
[58] Field of Search ..................... 333/29, 31 R, 31 C, 333/23, 705, 96; 336/180, 186–189, 191, 170, 171, 225

[56] References Cited

U.S. PATENT DOCUMENTS

| | | | |
|---|---|---|---|
| 2,178,653 | 11/1939 | Slade | 333/29 X |
| 3,299,375 | 1/1967 | Thompson | 333/96 |
| 3,421,119 | 1/1969 | Zerkin | 333/29 |
| 3,634,782 | 1/1972 | Marshall | 333/96 |

FOREIGN PATENT DOCUMENTS 62093 6/1968 German Democratic Rep. .

Primary Examiner—Alfred E. Smith
Assistant Examiner—Marvin Nussbaum
Attorney, Agent, or Firm—Smyth, Pavitt, Siegemund, Jones & Martella

[57] ABSTRACT

Two groups of conductors are wound helically with opposite pitch around a core and are further intertwined to establish a mesh, braid or plait. The conductors of each group are interconnected to establish the signal line and the return path for the delay line.

2 Claims, 2 Drawing Figures

DELAY LINE

BACKGROUND OF THE INVENTION

The present invention relates to a delay line which includes a principal signal path and a return path. The invention more particularly relates to such a delay line in which signal and return path lines are disposed on a common core.

The art of delay lines is well developed and includes a large variety of devices and circuit configurations. Generally speaking, they delay signals for specified periods of time. Many applications and electronic signals require the use and employment of such delay lines. The periods of delay may be as short as a fraction of a microsecond and as long as twenty microseconds, or even longer. For a variety of reasons, it is advisable to use a basic construction and configuration and to cut therefrom requesite lengths commensurate with the desired delays, which procedure is necessarily followed by calibration, fine tuning and trimming. In some cases, it is desirable to provide such a delay line in a physically short configuration requiring an accordingly high inductance.

A particular, known constructions for such a delay line includes a bifilar or double winding; signal transmission and return path portions are juxtaposed in each group of the winding. Such a device is easy to make but has certain drawbacks as regards electrical performance. First of all, the inductance is rather small, so that the delays which can be obtained from a given length of such a line are quite small. Also, the characteristic impedance is too small for many applications.

The East German Pat. No. 62093 describes a method for making delay lines in which signal line and return path are wound onto a common core, but in opposite helical pitch. Thus, the position of one line relative to the core changes a little on each cross point. A delay line made in that manner has a high inductance and is of symmetrical construction. Such coil assembly, however, cannot be made with conventional machines, but requires a specially constructed one. Accordingly, such delay lines are expensive.

DESCRIPTION OF THE INVENTION

It is an object of the present invention to provide a new and improved delay line which is of symmetrical construction, has or may have a rather high inductivity, and does not require highly specialized machines for manufacturing.

In accordance with the preferred embodiment of the invention, it is suggested to use groups of conductors as signal lines and as return lines and to wind these groups onto a core at opposite pitch in a manner so that they are intermeshed or braided. One needs an even number of conductors per group to make sure that all conductors of a group are mechanically equally long and, therefore, function electrically in synchronisation with each other. The advantage of the inventive arrangement is to be seen in that strict symmetry is ensured so that the length of the delay line in time remains proportional to the physical length of the assembly. Moreover, one can readily use conventional plaiting or braiding machines which intertwine the conductors merely through the relative positioning of groups of spools. One group of spools revolves about the core in one direction, while the other group revolves in the opposite direction.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawing in which:

Proceeding now to the detailed description of the drawings, FIG. 1 shows a core 1 made of any material which is suitable for use in delay lines. Depending upon the purpose, the core can be made of plastic or other material. Also, the cross-section of the core does not have to have the illustrated circular-cylindrical configuration. A signal line 2 and a return path line 3 each are helically wound around the core. FIG. 1 is schematic only to show the overall configuration. In reality, the line 2 and the line 3 each are composed of at least two conductors, and the two groups of conductors are intertwined in a braided or plaited pattern. Specifically, the signal line 2 may be composed of the two conductors 2a and 2b as shown in FIG. 2 and the return path may be composed of the two conductors 3a and 3b. The group of conductors 2a, 2b do not just cross the conductors 3a, 3b but are interwoven, intertwined or plaited. The conductors 2a and 2b are then interconnected at their ends to establish and to complete the signal line. The same is true with regard to conductors 3a, 3b of the return path. Each such conductor system is in fact a parallel circuit of the respective individual conductors.

The assembly 1, 2 and 3 is jacketed by and in an insulating sleeve or tube 4 which in turn is covered by a mesh 5 serving as a shield. Such a wire mesh is very flexible. Tube 4 is likewise flexible and made of polyethylene, polyvinylchloride or polytetrafluoroethylene. The core 1 may be comprised of the same kind of material.

Figure 1:
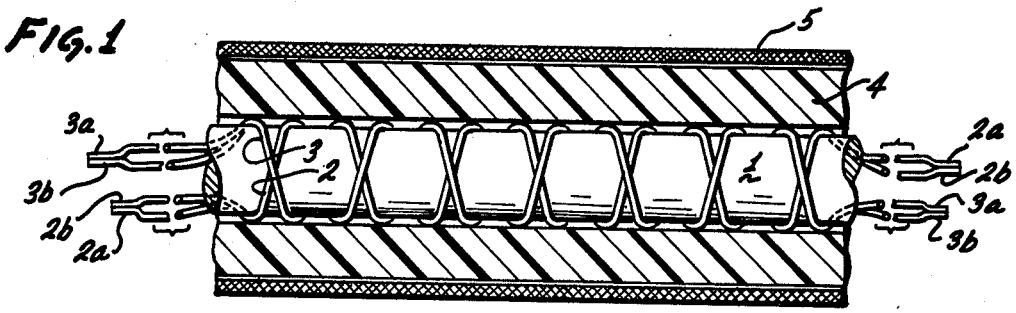
FIG. 1 is a schematic section view into a portion of a delay line constructed in accordance with the present invention.
Figure 2:
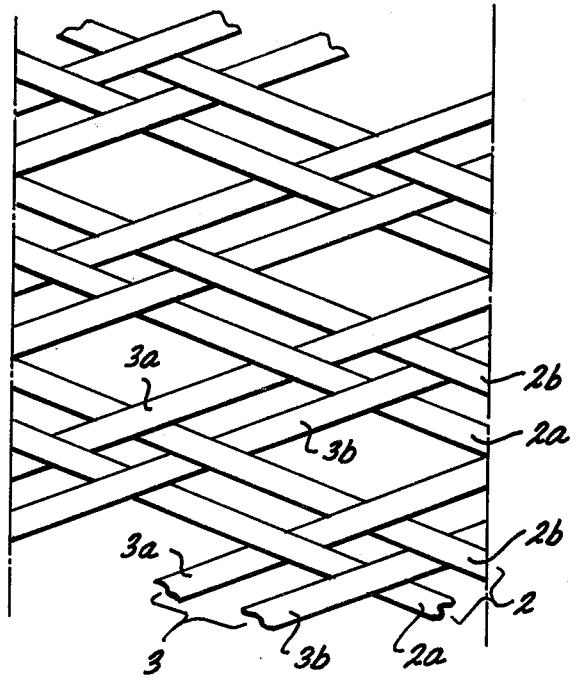
FIG. 2 is a geometric development of the several conductors as wound onto a core as per FIG. 1.

The delay line can be made simply by using a conventional braiding or plaiting machine with four spools, each such spool holds an insulated conductor, and during operation of the machine two of these spools revolve in one direction and the two others in the opposite direction. The spools are phased in such a manner that each conductor as laid will pass alternately under and over the conductors as laid by the oppositely revolving spools. This way one braids or plaits a mesh around core 1 which is configured as shown in FIG. 2. This figure is a geometric development but could also be understood as a plan view of a mesh cut along an axial line and folded back into a plane. The four conductors so braided are the conductors 2a, 2b, 3a and 3b. Each crossing of the signal line and of the return line is established by four cross-points. In two of them the return path conductors run under the signal conductors (3a under 2a; 3b under 2b) and in the two others the situation is reversed (3a over 2b; 3b over 2a). Due to the repetition of this pattern each conductor alternatingly crosses over and under the conductors of the other set. Due to the crossing, none of the conductors can consistently remain in a cylindrical surface but deflects therefrom radially outwardly. However, this deflection occurs similarly often for all conductors, so that the resulting cummulative length changes of each conductor is the same for all of them. Therefore, the plaiting ensures that all conductors have the same length. This is a very important feature for the performance of the delay line. It can readily be seen that the same rule applies as long as each group of conductors is composed of an even number of conductors, whereby the number of conductors of each group is "2" or an integral multiple of "2". Decisive is that following interconnection of the ends of the conductors of the same group, all lengths so connected are equal mechanically so that they can be and are also electrically similar.

The invention is not limited to the embodiments described above but all changes and modifications thereof not constituting departures from the spirit and scope of the invention are intended to be included.

I claim:

1. Delay line comprising:

a core;

a first group of insulated conductors being electrically connected in parallel, and being at their respective ends wound around the core in parallel relation to each other and in helical configuration;

a second group of insulated conductors also connected in parallel at their respective ends and being wound around the core in parallel relation to each other and in a helical configuration having opposite pitch so that the conductors of the first group intersect the conductors of the second groups establishing multiple intersections but without making contact, the conductors of the first group being braided with the conductors of the second group so that each conductor of the first group runs alternatingly over and under the conductors of the second group and vice versa, the first and second groups each constitute, respectively, signal path and return path for the delay line.

2. Delay line as in claim 1, wherein the groups each have even numbers of conductors.

* * * * *